(12) United States Patent
Azuma

(10) Patent No.: US 7,064,015 B2
(45) Date of Patent: Jun. 20, 2006

(54) SEMICONDUCTOR DEVICE AND MANUFACTURING METHOD OF THE SAME

(75) Inventor: Kosuke Azuma, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 135 days.

(21) Appl. No.: 10/412,345

(22) Filed: Apr. 14, 2003

(65) Prior Publication Data

US 2003/0209813 A1    Nov. 13, 2003

Related U.S. Application Data

(62) Division of application No. 10/234,379, filed on Sep. 5, 2002, now Pat. No. 6,836,011.

(30) Foreign Application Priority Data

Sep. 7, 2001  (JP) .............................. 2001-271279

(51) Int. Cl.
*H01L 21/48* (2006.01)
(52) U.S. Cl. ...................... 438/125; 257/734; 257/735; 257/736
(58) Field of Classification Search ................ 257/686, 257/777, 734; 438/125
See application file for complete search history.

(56) References Cited

U.S. PATENT DOCUMENTS 5,703,405 A * 12/1997 Zeber .......................... 257/777
6,316,288 B1 * 11/2001 Hashimoto ................... 438/118
2003/0057570 A1 * 3/2003 Ball ............................ 257/786

FOREIGN PATENT DOCUMENTS

| JP | 63-177434 | 7/1988 |
|---|---|---|
| JP | 64-50539 | 2/1989 |
| JP | 1-155633 | 6/1989 |
| JP | 1-303731 | 12/1989 |
| JP | 2000-294598 | 2/2000 |
| JP | 2000-68408 | 3/2000 |
| JP | 2000-164635 | 6/2000 |
| JP | 2001-85567 | 3/2001 |

* cited by examiner

*Primary Examiner*—Hoa Pham
*Assistant Examiner*—Nathan W. Ha
(74) *Attorney, Agent, or Firm*—Young & Thompson

(57) ABSTRACT

An interposer has a connection electrode formed on the insulating substrate surface, and a solder bump connects with the connection electrode. The insulating substrate surface is made rough where unevenness is formed, and the connection electrode peelable from the insulating substrate surface in a region with which the solder bump is connected by coating surface low active agent.

6 Claims, 14 Drawing Sheets

SEMICONDUCTOR DEVICE AND MANUFACTURING METHOD OF THE SAME

BACKGROUND OF THE INVENTION

1. Technical Field of the Invention

The present invention relates to a mounting structure to mount a semiconductor chip on a wiring substrate such as a mother board, particularly to a semiconductor device in which thermal stress occurred between the semiconductor chip and the mother board is absorbed to improve mounting reliability, and a manufacturing method thereof.

2. Description of the Related Art

There exists a flip chip connection structure, in which a solder bump provided for the semiconductor chip is made directly contact with a wiring land provided for the mother board, as a structure where the semiconductor chip formed of silicon is mounted on the wiring substrate such as the mother board primarily formed of resin such as epoxy. The flip chip structure has a simple structure and is capable of easy mounting. However, because silicon and resin whose coefficient of thermal expansion is different with each other are directly connected, there occurs thermal stress between the semiconductor chip and the mother board due to the difference of their coefficient of thermal expansion, the thermal stress is applied to the solder bump or the wiring land to cause crack in the solder bump to break connection of the semiconductor chip, and thus resulting in breaking of wire. To absorb such thermal stress, there has conventionally been proposed a structure in which underfill resin having coefficient of thermal expansion, whose value is between those of silicon and resin, is filled between the semiconductor chip and the motherboard. However, the art using such underfill resin causes a problem of maintenance because the semiconductor chip once mounted on the motherboard cannot be removed for replacement.

For this reason, art to absorb thermal stress occurred between the semiconductor chip and the mother board without using the underfill resin is described, and Japanese Patent No. 2738711 proposes a structure as the wiring land of the mother board, where an electrode structure has free deformation characteristic and spring characteristic in horizontal directions, thermal stress is absorbed in such a manner that the thermal stress deforms the wiring land, and crack in the solder bump is prevented. A manufacturing method to realize the structure is that a lift off film is formed on the surface of the mother board, a metal film where the wiring land is formed is formed on the lift off film, and a pattern is formed on the metal film so as to have a bent shape or a curve shape in horizontal directions. Further, the wiring land, where a pattern is formed, has a structure that one end portion thereof is fixed to the motherboard, and the lift off film is etched and removed thereafter, so that the wiring land is formed as an electrode where the other end portion is in a floating state above the motherboard surface. Accordingly, since the wiring land to be formed, that is, the electrode is a cantilever electrode, whose one end portion is fixed and the other end portion is a free end in the floating state, thermal stress occurred is absorbed by deformation due to free deformation characteristic and spring characteristic of the electrode by bonding the solder bump of the semiconductor chip with the other end portion, and thus crack of the solder bump is prevented. The similar art is described in Japanese Patent Laid-open No. S63-177434, No. S64-50539, and No. H1-303731.

However, this art requires a process of forming the lift off film and removing it by etching in order to form the electrode in the floating state on the mother board surface, which makes a manufacturing process complicated. Further, since the other end portion of the electrode floats above the mother board surface, there is a danger that the electrode formed on the mother board surface may be deformed or broken when it touches other parts, foreign material, or the like. Furthermore, in the state where the semiconductor chip is bonded with the electrode of the floating structure by the solder bump, the semiconductor chip is in an unstable state for the motherboard due to elasticity of the electrode, and there is also a danger that the semiconductor chip easily drops from the motherboard by external force.

Moreover, although the wiring land of the mother board is formed as the electrode of the floating structure in the conventional art, the number of the wiring land is very large because of a large size of the mother board, which makes it difficult to preferably manufacturing all wiring lands, and thus there exists a problem that manufacturing yield is poor and the mother board becomes expensive as a result. Consequently, a structure is possible that the conventional wiring land structure is used for the mother board as it is, the semiconductor chip is mounted on a middle substrate referred to as an interposer, and the chip is mounted on the mother board via the interposer. For example, it is a structure as described in Japanese Patent Laid-open No. 2000-164635 in which the semiconductor chip is mounted on the interposer substrate and an electrode such as a solder ball is used as an external electrode. The interposer substrate is formed using a material having the same coefficient of thermal expansion as that of the mother board, an electrode structure is formed between the semiconductor chip and the interposer to absorb thermal stress, and thus eliminating thermal stress between the mother board and the interposer. With this art, since the structure to absorb thermal stress may be adopted only for the interposer, the manufacturing yield improves and the motherboard can be prevented from becoming expensive.

The art described in Japanese Patent Laid-open No. H1-155633, for example, is possible as the electrode structure to absorb thermal stress in the interposer substrate. In this art, an organic film with conductor is inserted between the semiconductor chip and the mother board, one end portion of the conductor provided for the organic film is connected with the solder ball of the semiconductor chip, and the other end portion of the conductor is connected with the wiring land of the mother board. Then, the conductor is formed in the cantilever structure so as to create spring characteristic, and it is possible to absorb thermal stress between the semiconductor chip and the wiring board.

However, in the art described in the gazette, because the structure of the conductor provided for the organic film with conductor is substantially same as the structure of the electrode of the floating structure, which has been applied for the mother board described in the foregoing gazette, it requires the manufacturing method by the lift off film and the manufacturing process becomes complicated. In addition, it is easily broken because the conductor has the floating structure, and the semiconductor chip is in the unstable state when it is mounted on the interposer due to elasticity of the conductor, and there is a danger that the semiconductor chip easily drops by external force.

SUMMARY OF THE INVENTION

An object of the present invention is to provide a semiconductor device that can be easily manufactured and can stably hold the semiconductor chip while thermal stress occurred between the semiconductor chip and the substrate mounting the chip is absorbed, and a manufacturing method thereof.

A semiconductor device according to the present invention comprises: a first member having a first electrode; and a second member having an insulating substrate and a second electrode formed on the surface of the insulating substrate and connected with the first electrode. The second electrode is constituted as a connection electrode that is easily peeled off from the surface of the insulating substrate in a connection region with the first electrode than the other region.

As a first mode of the semiconductor device of the present invention, it is the semiconductor device that comprises: a semiconductor chip having a conductor bump; and a mounting substrate having an insulating substrate and a connection electrode formed on the surface of the insulating substrate and with which the conductor bump is connected. The connection electrode has a structure that it is easily peeled off from the surface of the insulating substrate in the region where the conductor bump is connected than the other region.

As a second mode of the semiconductor device of the present invention, it is the semiconductor device that comprises: a semiconductor chip having a conductor bump; an interposer mounting said semiconductor chip; and a mother board mounting said interposer. Said interposer has: an insulating substrate; a connection electrode formed on the surface of said insulating substrate, one end portion being connected with the conductor bump of said semiconductor chip, and the other end portion being integrally supported by said insulating substrate; and a conductor ball formed on a rear surface of said insulating substrate and connected with the other end portion of said connection electrode. Said mother board has a wiring land connected with the conductor ball of said interposer. Said interposer is formed of a material having the same or substantially equal coefficient of thermal expansion as that of said mother board, and said connection electrode has a structure that the one end portion where said conductor bump is connected is easily peeled off from the surface of said insulating substrate than the other end portion.

As a third mode of the semiconductor device of the present invention, it is the semiconductor device that comprises: a semiconductor chip having a conductor bump; an interposer mounting said semiconductor chip; and a mother board mounting said interposer. Said interposer has: an insulating substrate; a connection electrode formed on a rear surface of said insulating board; and a conductor ball provided at one end portion of said connection electrode, said conductor ball being connected with a wiring land of said mother board. Said conductor bump of said semiconductor chip mounted on a surface of said insulating substrate is connected to the other end portion of said connection electrode. Said interposer is formed of a material having the same or substantially equal coefficient of thermal expansion as that of said semiconductor chip, and the connection electrode has a structure that the one end portion of the connection electrode is easily peeled off from a bottom surface of said insulating substrate than the other end portion.

Herein, it is preferable that the surface of the insulating substrate on which the connection electrode is formed is formed in a rough surface and a constitution is made such that connection electrode is formed in a close contact state with convex portions of the rough surface. Furthermore, the connection electrode is one that an interconnecting portion connecting one end portion with the other end portion is formed in a bent pattern shape on the surface of the insulating substrate, and the one end portion and the interconnecting portion are formed so as to be easily peeled off from the surface of the insulating substrate.

Further, in the manufacturing method of the semiconductor device of the first mode that comprises: the first member having the first electrode; and the second member having the second electrode formed on the surface of the insulating substrate and connected with the first electrode, the manufacturing method of the second member includes the steps of: forming a through hole on a required position of the insulating substrate; performing processing to reduce a degree of surface activeness of the surface of a region other than the region of the through hole on the surface of the insulating substrate; and forming the second electrode formed of the connection electrode with a required pattern in the region including the through hole on the surface of the insulating substrate, in which the second electrode is connected with the insulating substrate in the through hole region, and formed in the state that it is easily peeled off from the surface of the insulating substrate in the region other than the through hole.

In the manufacturing method of the present invention, the step of performing processing to reduce the degree of surface activeness of the surface other than the region of the through hole on the surface of the insulating substrate further includes the steps of: making the region on the surface of the insulating substrate become a rough surface to form fine concave portions and convex portions; and coating surface low active agent on the surface of the insulating substrate to leave the agent in the concave portions, and the step of forming the second electrode further includes the steps of: plating a conductive material on the surface of the insulating substrate and the inner surface of the through hole to form a plated film; and forming the plated film in a required pattern to form a through hole electrode and the connection electrode respectively on the through hole inner surface and the surface of the insulating substrate, in which the second electrode is in the state that it connects with the through hole electrode in one portion and closely contacts with the insulating substrate at the vertex of the convex portions of the insulating substrate in another portion.

Alternatively, in the manufacturing method of the present invention, the first member is the semiconductor chip, the first electrode is the conductor bump provided for the semiconductor chip, and the second member is the interposer for mounting the semiconductor chip on the mother board, which has substantially equal coefficient of thermal expansion to that of the mother board, in which the through hole electrode penetrating the insulating substrate of the interposer in a thickness direction is formed, the second electrode, which is formed of the connection electrode connected with the through hole electrode at the other end portion, is formed on the surface of the insulating substrate, and the conductor ball, which is connected with the through hole electrode to make connection with the mother board, is formed on the rear surface of the insulating substrate.

Moreover, in the manufacturing method of the present invention, the first member is the interposer mounting the semiconductor chip, which has coefficient of thermal expansion substantially equal to that of the semiconductor chip, the first electrode is the conductor ball provided for the interposer, the second member is the mother board, and the second electrode is the wiring land provided on the surface of the mother board, in which the through hole electrode penetrating the insulating substrate of the interposer in a thickness direction is formed, and the connection electrode is formed, in which the through hole electrode is connected with the other end portion on the rear surface of the insulating substrate and the conductor ball is disposed in one end portion.

According to the semiconductor device of the present invention, when thermal stress occurs between the first member and the second member based on the difference of coefficient of thermal expansion and the thermal stress is applied to the first electrode and the second electrode, the connection electrode is peeled off from the surface of the insulating substrate of the second member in one portion to absorb thermal stress by elastic deformation of the connection electrode, and thus breakage of the first electrode and the second electrode is prevented. Further, since the connection electrode is in a close contact state with the second member when thermal stress is not applied, the first member can be mounted in a stable state.

THE PREFERRED EMBODIMENTS OF THE INVENTION

Figure 1:
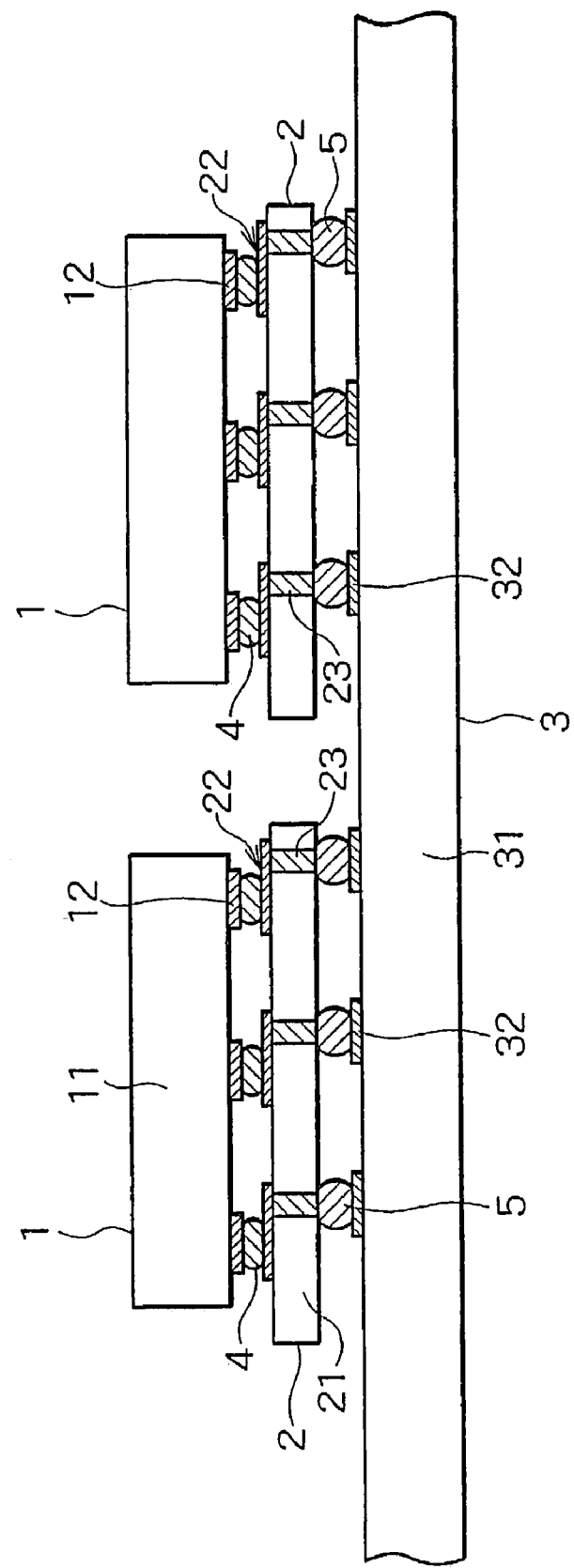
FIG. 1 is a cross-sectional view of the semiconductor device of the present invention.
Figure 2:
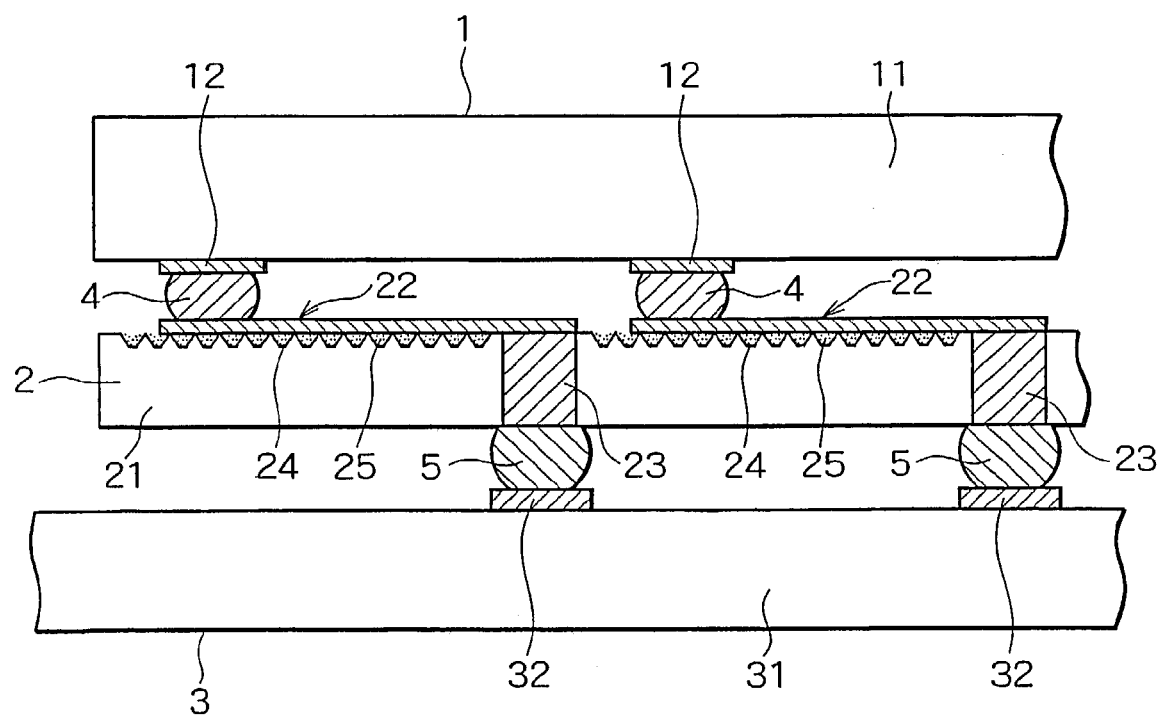
FIG. 2 is a partially enlarged view of FIG. 1.

Next, embodiments of the present invention will be described with reference to the drawings. FIG. 1 is a cross-sectional view of the first embodiment of the present invention, and FIG. 2 is an enlarged cross-sectional view of a part thereof. A plurality of semiconductor chips 1 are severally mounted on individual interposer 2 by the flip flop connection, and the semiconductor chip 1 and the interposer 2 constitute the semiconductor device. The semiconductor chip 1 is one where required elements (not shown) are formed on a semiconductor substrate 11 such as silicon, connection lands 12 are disposed on its principal surface, solder bumps 4 are provided on the surface of the connection lands 12, and the chip is mounted on the interposer 2 with the principal surface facing downward. The interposer 2 is mainly constituted of an insulating substrate 21, connection electrodes 22 (described later) are formed on the top surface of the insulating substrate 21, and the solder bumps 4 are joined to one end portions thereof. Further, the other end portion of the connection electrodes 22 are connected with the top end surface of a through hole electrodes 23 penetrating the insulating substrate 21 in the thickness direction. The bottom end surface of the through hole electrode 23 is exposed to the bottom surface of the insulating substrate 21, where solder balls 5 are joined. Then, the solder balls 5 disposed on the bottom surface of the interposer 2 are joined to wiring lands 32 provided on the top surface of an insulating substrate 31 of a mother board 3 as shown in the drawing, and mounting is thus performed.

Figure 3A:
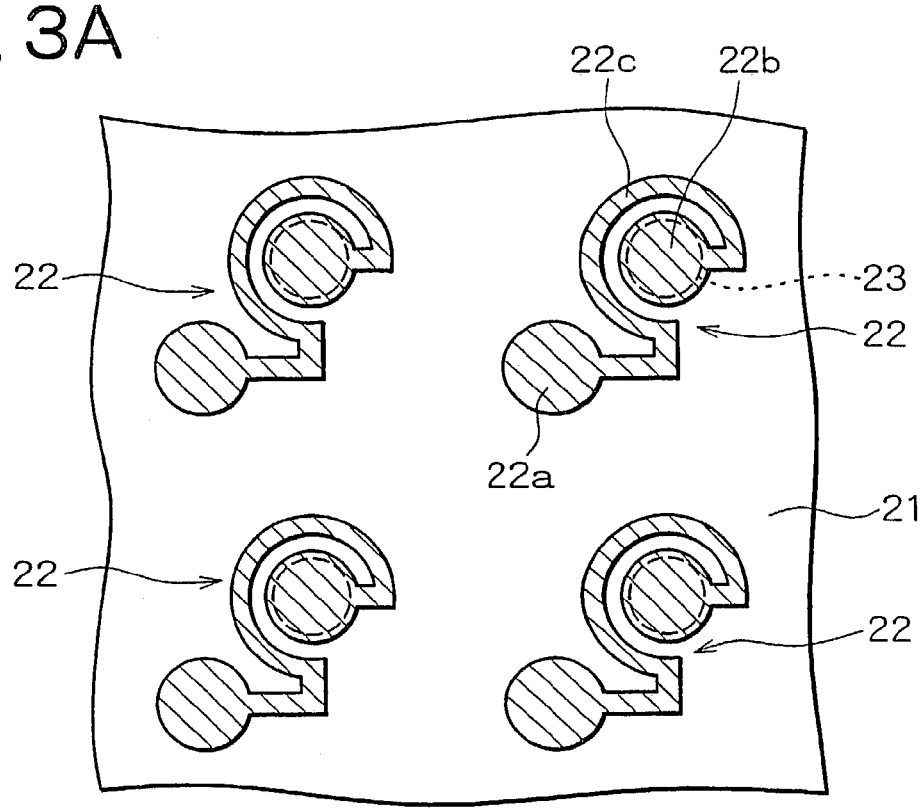
FIGS. 3A and 3B are a top plan view and a bottom plan view of the interposer, respectively.
Figure 3B:
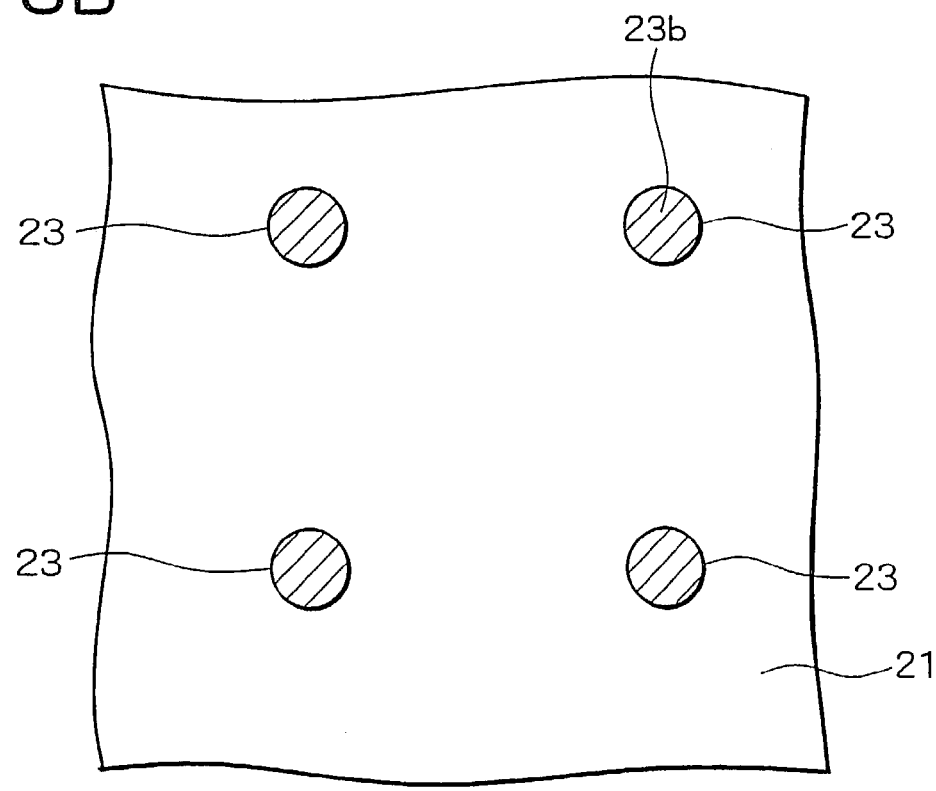
Figure 4:
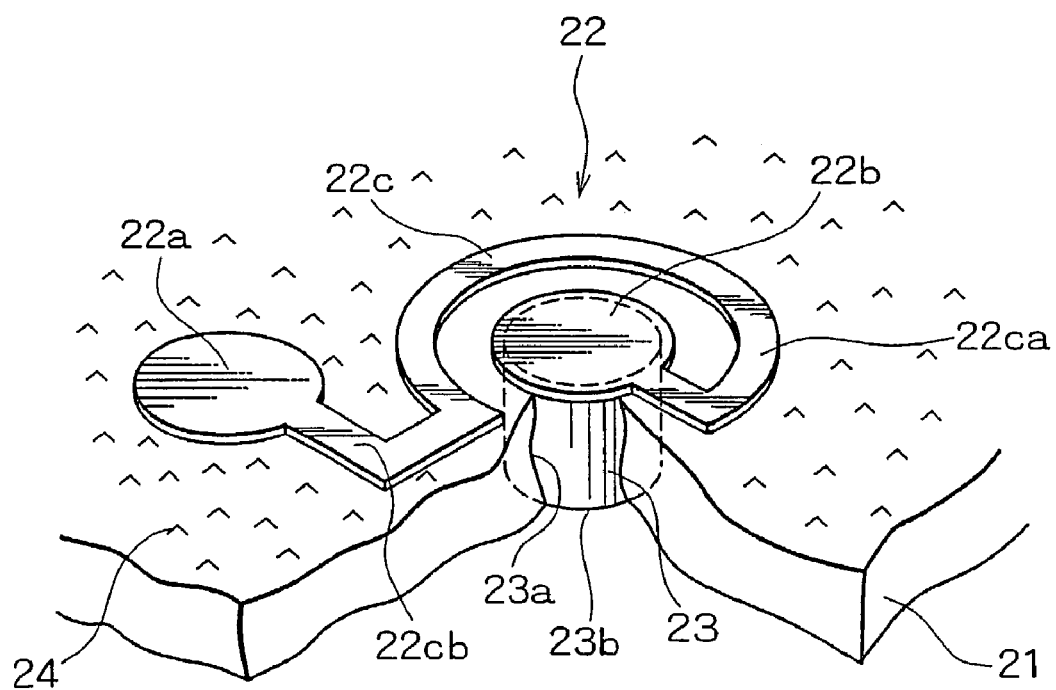
FIG. 4 is a broken enlarged perspective view of a part of the interposer.

Description will be made in detail for the interposer 2. FIGS. 3A and 3B are the top plan view and the bottom plan view of a partial region of the interposer 2, respectively. FIG. 4 is the enlarged broken perspective view of a portion thereof. The interposer 2 is mainly formed of the same material as the mother board such as epoxy resin or the insulating substrate 21 having substantially equal coefficient of thermal expansion to that of the mother board, and the through hole electrodes 23 are severally disposed at planar positions that are slightly off from the connection lands 12 of the semiconductor chip 1. The through hole electrode 23 is constituted such that a conductive material 23b is filled in an opening 23a penetrating the insulating substrate 21 in the thickness direction. Furthermore, in the connection electrode 22 formed on the top surface of the insulating substrate 21, one end portion 22a is formed as a chip land portion arranged on a position corresponding to the connection land 12 of the semiconductor chip 1, the other end portion 22b is formed as a through hole land portion integrally connected with the top end surface of the through hole electrode 23, and constitution is made that the both land portions 22a, 22b are interconnected by an interconnecting portion 22c with a pattern shape bent on the same plane. In this example, the interconnecting portion 22c is formed of an arc shape portion 22ca that surrounds substantially ¾ of the circumference of the through hole land portion 22b and a straight line portion 22cb extending from the arc shape portion 22ca to the chip land portion 22a. Note that the solder balls 5 are directly joined to the bottom end surface of the through hole electrodes 23 at the bottom surface of the interposer 2.

Figure 5:
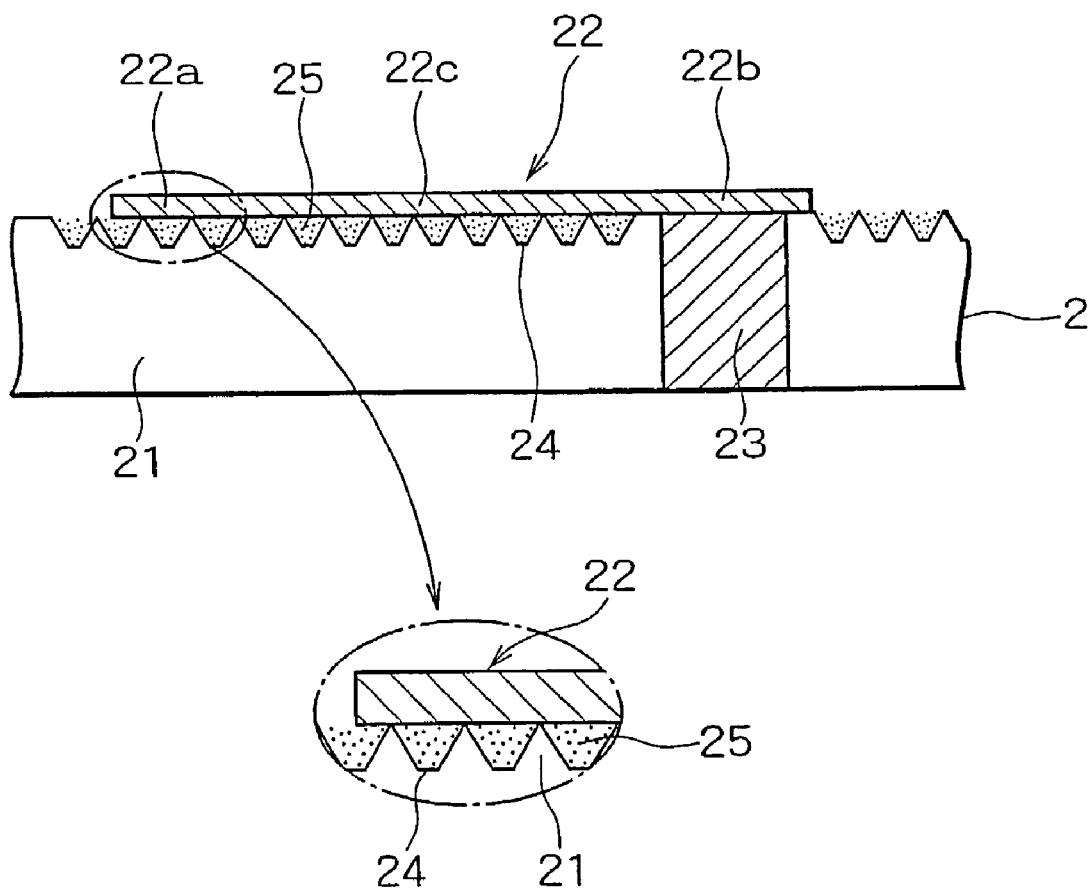
FIG. 5 is an enlarged cross-sectional view of the interposer.

Further, as FIG. 5 shows the enlarged schematic cross-sectional view of a part of the interposer 2, the connection electrode 22 has a structure that the region other than the through hole land portion 22b, that is, the chip land portion 22a and the interconnecting portion 22c that are the region other than the area connected with the through hole electrode 23, easily peels off from the surface of the insulating substrate 21, and it is constituted such that the region is relatively easily peeled off from the top surface of the insulating substrate 21 by stress applied to the chip land portion 22a, particularly. For example, relatively rough unevenness 24 is formed on the top surface of the insulating substrate 21 in this example, surface low active agent 25 (described later) is coated inside the unevenness 24, and the rear surface of the connection substrate 22 closely contacts with the top surface of the insulating substrate 21 only at the vertex of the unevenness 24, where the surface low active agent 25 is not coated. Thus, the stress applied to the connection electrode 22 relatively easily peels off the connection electrode 22 from the top surface of the insulating substrate 21.

Figure 6A:
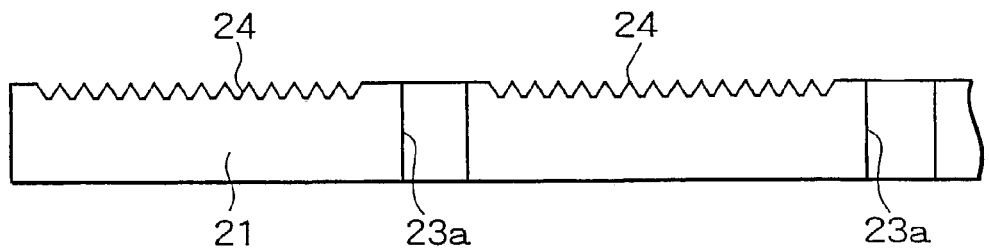
FIGS. 6A to 6D are process cross-sectional views showing the manufacturing method of the interposer.
Figure 6B:
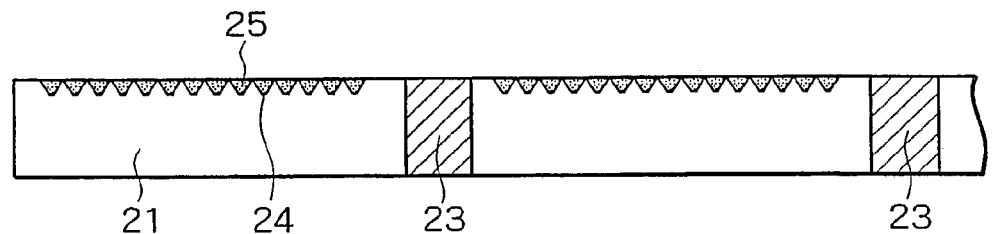
Figure 6C:
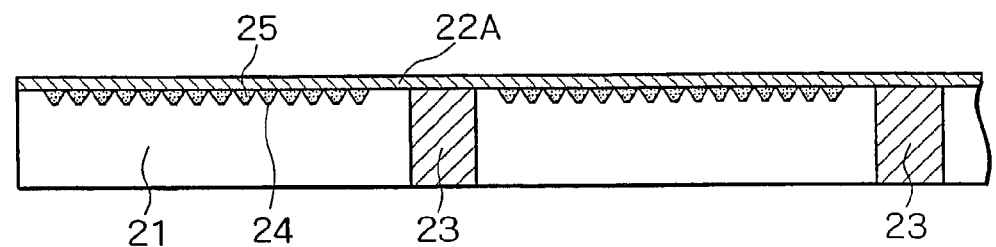
Figure 6D:
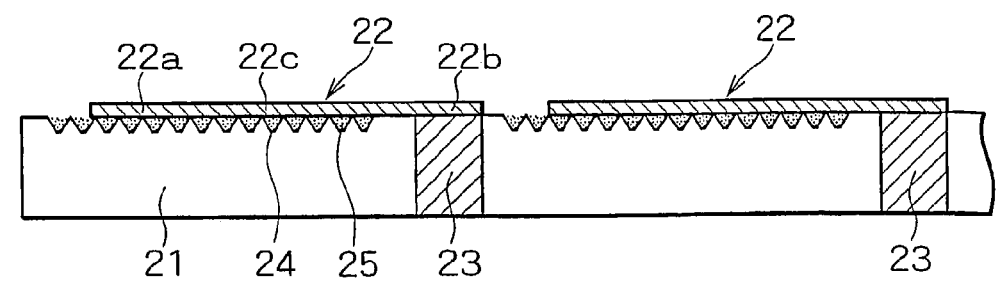

Description will be made for an example of the manufacturing method of the interposer 2 that includes the connection electrode 22. As shown in FIG. 6A, the openings penetrating in the thickness direction, that is, the through holes 23a are opened by a selective etching method or a mechanical hole opening method such as drilling and punching on a required positions of the insulating substrate 21 of the interposer 2. Next, liquid including fine particles is sprayed on the top surface of the insulating substrate 21, and the fine unevenness 24 is formed on the top surface of the insulating substrate 21 to make it rough by a so-called wet blasting method. Then, as shown in FIG. 6B, a material having low surface activeness (surface low active agent) 25 is thinly coated on the top surface of the insulating substrate 21. Due to the coating, the surface low active agent 25 attaches only to the inside the concave portions of the unevenness 24, and it does not attach to the vertex areas of the convex portions. Subsequently, conductor such as Cu is filled inside the through holes 23a by a selective plating method to form the through hole electrodes 23. After that, a plated film 22A of Cu, Au, Ni or the like is formed on the top surface of the insulating substrate 21 by a plating method as shown in FIG. 6C. Thereafter, as shown in FIG. 6D, the plated film 22A on the top surface is selectively etched by a photolithography technology or the like to form a pattern like FIG. 3A, and the connection electrodes 22 are thus formed on the top surface of the insulating substrate 21. In the connection electrodes 22 formed in the foregoing manner, the top surface of the insulating substrate 21 is made become a rough surface and the surface low active agent 25 is coated inside the unevenness 24. Therefore, although the through hole land portion 22b is unified with the through hole electrode 23 and in a securely connected state with the insulating substrate 21, the bottom surface of the chip land portion 22a and the interconnecting portion 22c closely contacts only with the vertex of the unevenness 24, which is easily peeled off from the top surface of the insulating substrate 21 with relatively small force. For example, it has peel strength of about 1.96 N/cm (0.2 kgf/cm).

Figure 7:
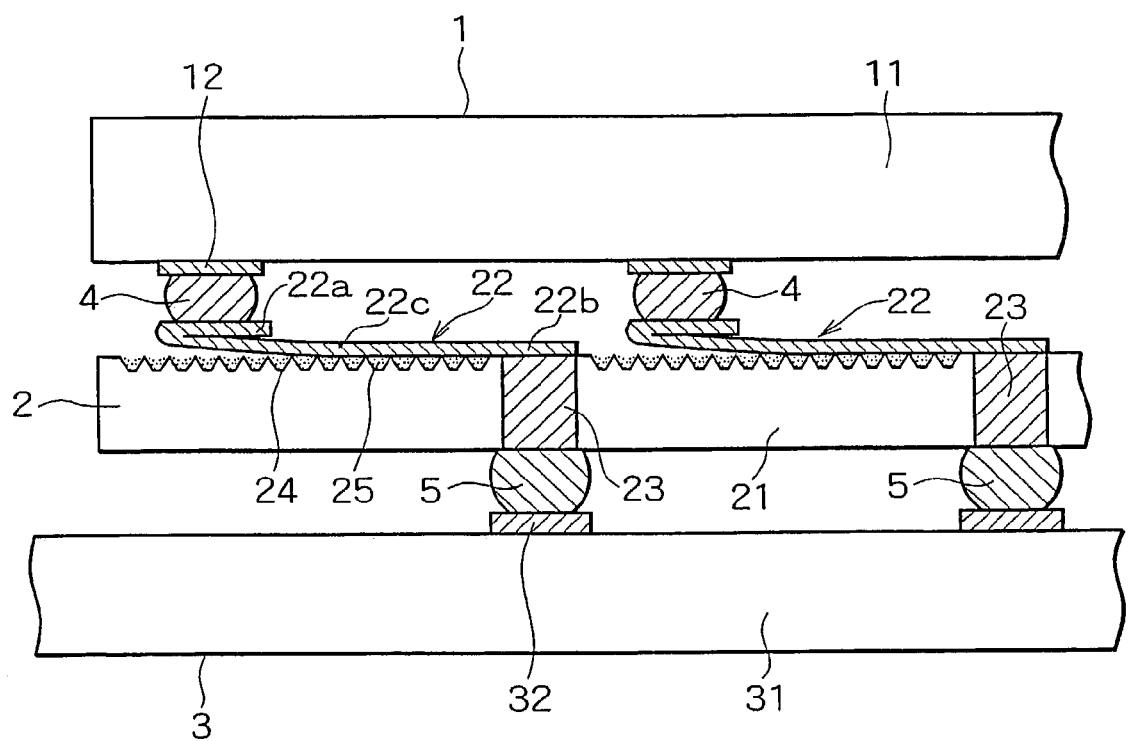
FIG. 7 is a cross-sectional view showing an operational state of the connection electrode, which corresponds to FIG. 2.

According to the semiconductor device of the foregoing constitution, when it receives thermal hysteresis in the state where it is mounted on the mother board 3, thermal stress does not occur between the mother board 3 and the interposer 2 because they have substantially equal coefficient of thermal expansion, and occurrence of crack or the like in the solder ball 5 joined to the wiring land 32 of the mother board 3 is prevented. On the other hand, thermal stress based on the different coefficient of thermal expansion occurs between the semiconductor chip 1 and the interposer 2. The thermal stress is applied to the solder bump 4 and is further applied to the connection electrode 22 of the interposer 2, where the solder bump 4 is connected. Accordingly, as shown in FIG. 7, the chip land portion 22a of the connection electrode 22, where the solder bump 4 is connected, is peeled off from the top surface of the insulating substrate 21 of the interposer 2. Moreover, the region from the chip land portion 22a to the interconnecting portion 22c of the connection electrode 22 is peeled off according to the size of stress applied, but through hole land portion 22b is not peeled off since it is integrally connected with the top end surface of the through hole electrode 23. Then, in the state where the connection electrode 22 is peeled in this manner, the region from the chip land portion 22a to the interconnecting portion 22c is in a floating state above the top surface of the insulating substrate 21 due to stiffness and elasticity of the connection electrode 22 itself. As described, the connection electrode 22 peels off from the insulating substrate 21 and the region from the chip land portion 22a to the interconnecting portion 22c make elastic deformation, and the thermal stress occurred between the semiconductor chip 1 and the interposer 2 is thus absorbed.

Consequently, in the manufacturing process of the semiconductor device of the present invention, the surface of the insulating substrate 21 is processed to be the rough surface in forming the interposer 2 and the same process of the plating method and pattern formation as a process of forming an electrode by a conventional general conductive film is performed after the rough surface processing, and then the connection electrode 22 of the present invention is formed. Accordingly, a process to previously make the connection electrode be in the floating state like conventional various kinds of electrodes is not necessary, which simplifies a manufacturing process, and a low manufacturing cost can be realized. Further, in the interposer 2 of the present invention, since the connection electrode 22 is in the close contact state with the surface of the insulating substrate 21 from the point when thermal stress occurs until peeling occurs after the semiconductor chip 1 is mounted on the interposer 2 and is further mounted on the mother board 3, the connection electrode 22 is not broken before the semiconductor chip 1 is mounted. Furthermore, all the connection electrodes 22 to which the solder bumps 4 are joined do not peel off even under the state where thermal stress occurs to peel off the connection electrode 22. Normally, the connection electrode 22 in the center region is not peeled off often because the center region of the semiconductor chip 1 has lower thermal stress comparing to the peripheral region, and it is possible for the connection electrode that is not peeled off to stably hold the semiconductor chip 1 on the interposer 2.

Herein, in the interposer, by appropriately adjusting the roughness of the unevenness 24 formed on the top surface of the insulating substrate 21, a coating amount of the surface low active agent 25, or the like in the process of FIGS. 6A and 6B, strength of close contact of the connection electrode 22 to the insulating substrate 21, that is, the peel strength can be adjusted. For example, by making the rough surface rougher to reduce the area where the connection electrode 22 and the insulating substrate 21 closely contact, which can make peeling easier. Further, by increasing the coating amount of the surface low active agent 25 before forming the connection electrode 22, the degree of close contact between the connection electrode 22 and the insulating substrate 21 is reduced to make peeling easier. Alternatively, peeling can be made easier by supplying chemical liquid to reduce the degree of close contact between the connection electrode 22 and the insulating substrate 21 after formation of the connection electrode 22. With these methods, by setting the peel strength to an appropriate level according to the difference of coefficient of thermal expansion between the semiconductor chip 1 and the interposer 2, size difference of the semiconductor chip 1, or the like, it is possible to obtain the semiconductor device in which thermal stress occurred between the semiconductor chip 1 and the interposer 2 is properly absorbed and the connection electrode is not easily peeled off to stably hold the semiconductor chip 1. This is particularly effective when the interposer 2 is formed of a material having coefficient of thermal expansion whose value is between those of the semiconductor chip 1 and the mother board 3.

Figure 8A:
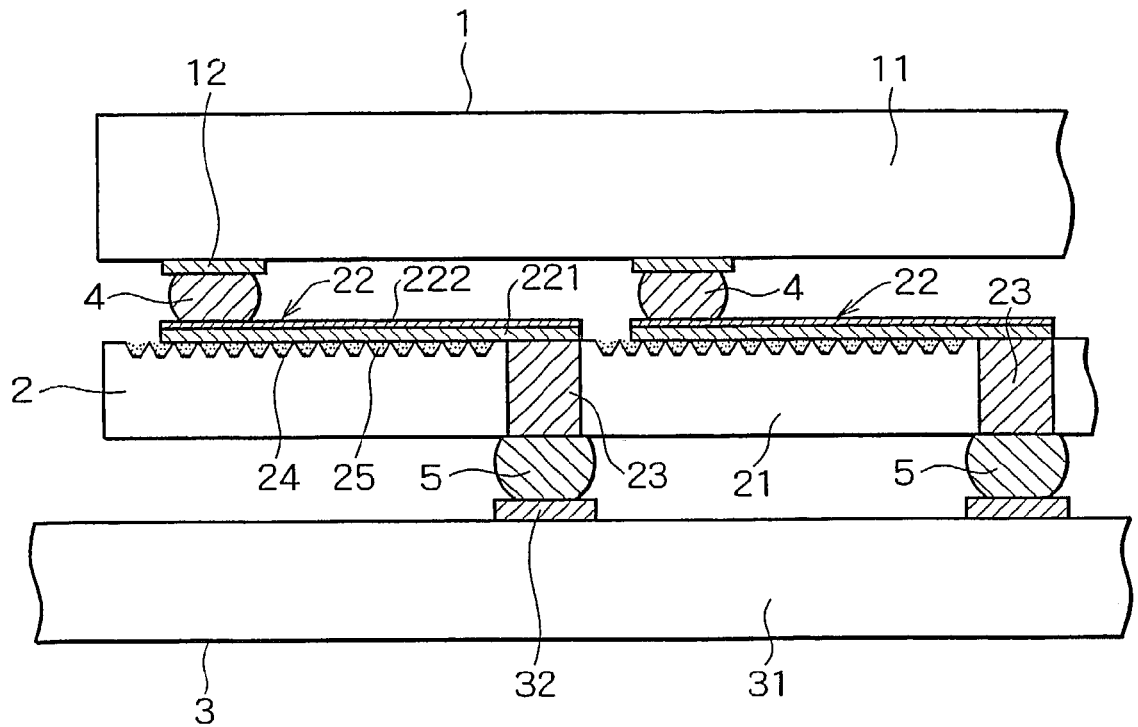
FIGS. 8A and 8B are cross-sectional views of another embodiment of the present invention.
Figure 8B:
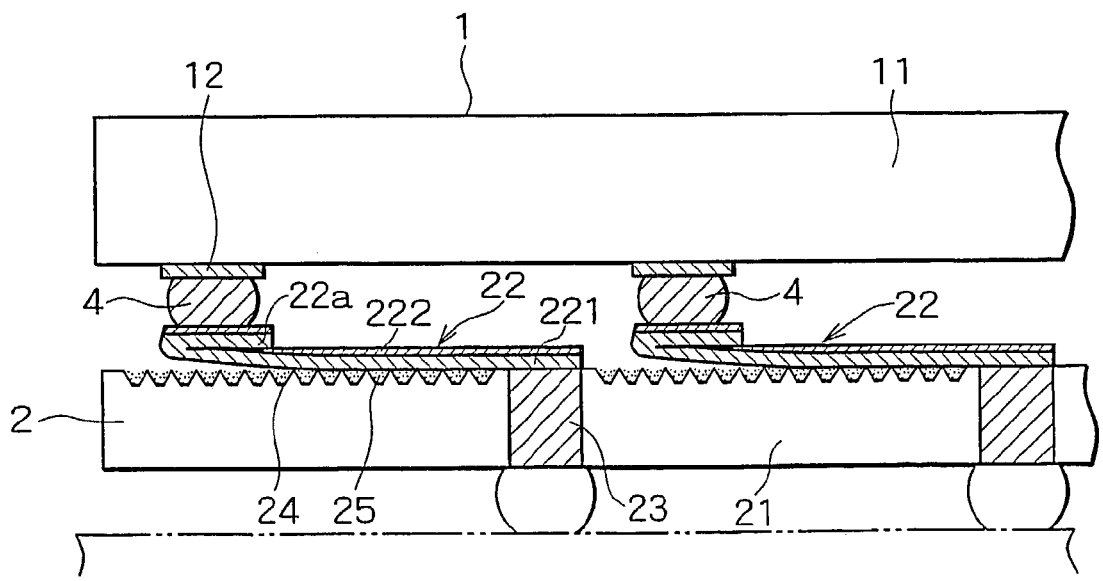

FIG. 8A is the cross-sectional view of the principal part of the second embodiment of the present invention. Note that the same reference codes are applied to parts equal to those of the first embodiment in the following embodiments. In this embodiment, the connection electrode 22 provided for the interposer 2 is in 2-layer construction. Specifically, the connection electrode 22 is formed of a lower layer 221 of a metal material having a large coefficient of thermal expansion and an upper layer 222 of a metal material having coefficient of thermal expansion smaller than that of the lower layer. For example, the lower layer 221 is formed of copper and the upper layer 222 is formed of copper alloy. With this configuration, bimetal effect occurs in the connection electrode 22 as shown in FIG. 8B due to the difference of coefficient of thermal expansion between the upper and lower layers 221, 222 when the semiconductor device receives thermal hysteresis, which warps the connection electrode 22 upward in a concave state. This warp force facilitates the peeling of the connection electrode 22 on the top surface of the insulating substrate 21, and effect of easing thermal stress in the solder bump 4 can be improved.

Figure 9:
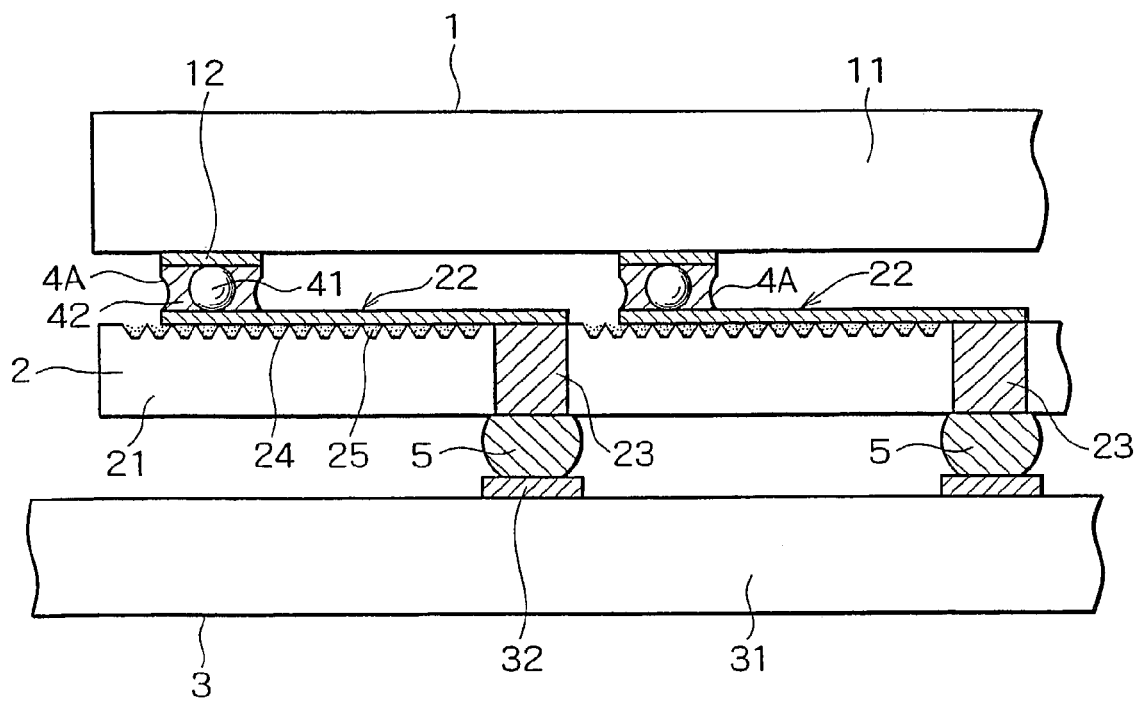
FIG. 9 is a cross-sectional view of another different embodiment of the present invention.

FIG. 9 is the cross-sectional view of the principal part of the third embodiment of the present invention. In this embodiment, a combined solder bump is used instead of the solder bump 4 formed on the connection land 12 on the principal surface of the semiconductor chip 1. A combined solder bump 4A has a relatively stiff core body 41 therein and is constituted that a solder film 42 is disposed so as to cover the circumference of the core body 41. Rigid resin with heat resistance or a high melting point metal is used as the core body 41. With the use of such combined solder bump 4A, when mounting the semiconductor chip 1 on the interposer 2, only the solder 42 of film state in the periphery of the combined solder bump 4A melts and the connection land 12 and the connection electrode 22 are connected in the state where the core body 41 is sandwiched. This can restrict increase of the amount of the solder 42 melted by the thermal processing at this point, and the melted solder 42 is prevented from flowing to an adjacent electrode to cause short between the electrodes. Further, the core body 41 maintains a gap dimension between the semiconductor chip 1 and the interposer 2, which can prevent the short between the adjacent electrodes by melted solder more efficiently. With this configuration, arrangement pitch dimension of the connection land 12 of the semiconductor chip 1 and of the connection electrode 22 of the interposer 2 can be promoted more finely, which can realize higher integration.

Figure 10:
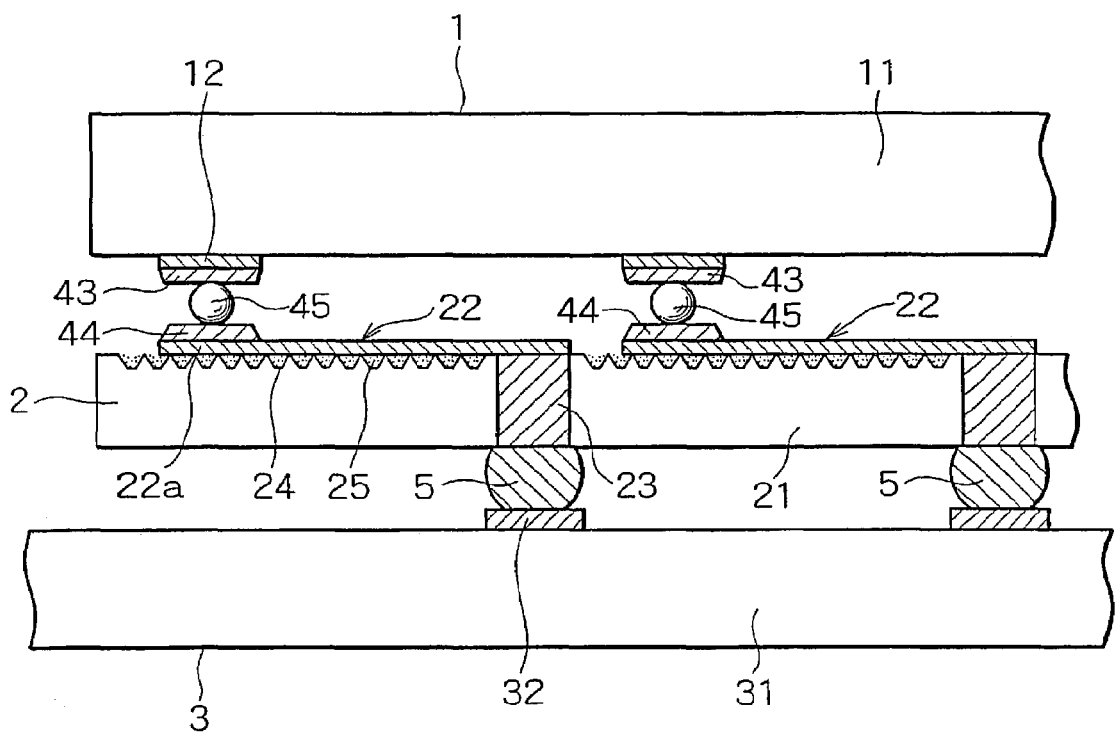
FIG. 10 is a cross-sectional view of a variation of the embodiment shown in FIG. 9.

Alternatively, in the third embodiment, solder 43, 44 is printed on the surface of the connection land 12 of the semiconductor chip 1 and the surface of the one end portion (chip land portion) 22a of the connection electrode 22 of the interposer 2, and a core ball 45 formed of a metal ball or a resin ball, to which metal plating of Au or the like has been performed, is temporarily fixed on the connection land 12 of the semiconductor chip 1, as in the cross-sectional view shown in FIG. 10. Then, reflowing is performed in the state where the core ball 45 is placed on the connection electrode 22 of the interposer 2, and it may be constituted that the solder 43, 44 is melted to allow it to flow along the surface of the core ball 45 in order to connect the connection land 12 with the connection electrode 22 via solder. A connected state will be the same as the case of the embodiment of FIG. 9. In this constitution as well, the amount of solder reduces to prevent short between the adjacent electrodes by melted solder, and higher integration can be realized.

Figure 11:
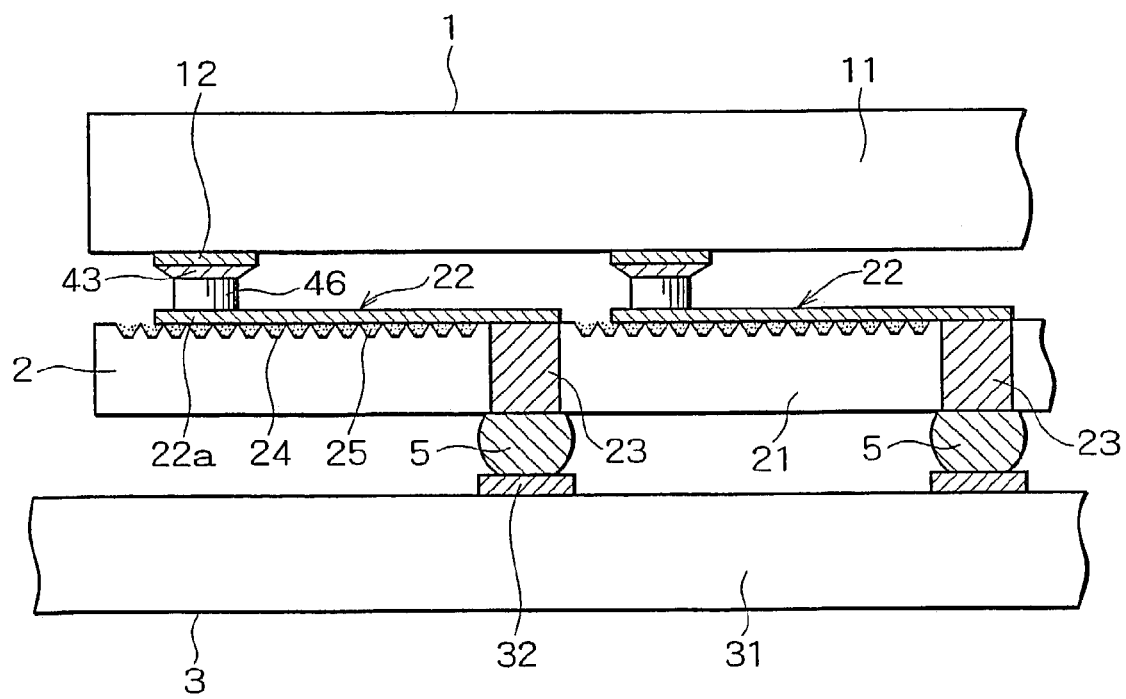
FIG. 11 is another cross-sectional view of the variation of the embodiment shown in FIG. 9.

In this case, as shown in FIG. 11, it may be constituted that a post 46 of column shape formed of Cu or the like in a required height is integrally provided in a standing manner on the one end portion (chip land portion) 22a of the connection electrode 22 of the interposer 2, while the solder 43 is printed on the surface of the connection land 12 of the semiconductor chip 1 similarly to the foregoing embodiment. The post 46 can be manufactured by applying selective plating of a required thickness on the surface of the connection electrode 22 using a resist mask or the like, for example. The height dimension of the post 46 is 0.05 mm, for example. In this embodiment, performing reflowing in the state where the connection land 12 of the semiconductor chip 1 is aligned to the post 46 and is in contact with the post allows the top surface of the post 46 to be soldered to the connection land 12, which further reduces the solder amount, melted solder does not flow on the surface of the connection electrode 22, and thus short between the adjacent electrodes by solder is prevented.

Figure 12:
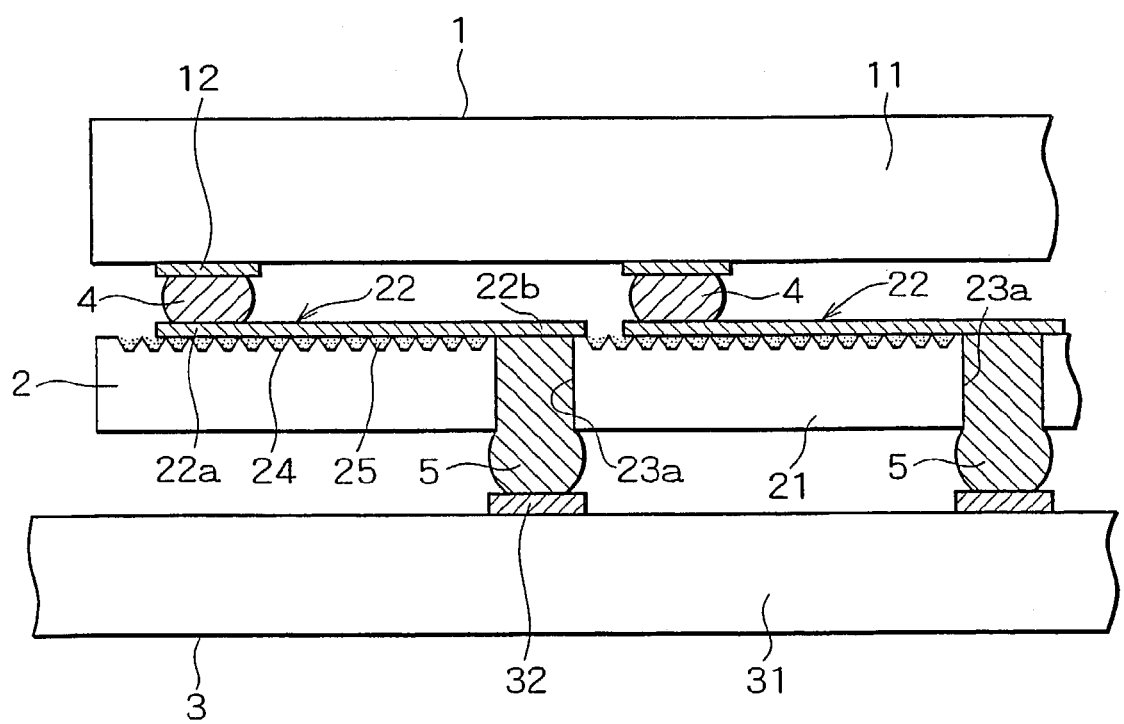
FIG. 12 is a cross-sectional view of another different embodiment of the present invention.

FIG. 12 is the cross-sectional view of the principal part of the fourth embodiment of the present invention. This embodiment is constituted that the solder ball 4 formed on the bottom surface of the insulating substrate 21 serves as an equal function to the through hole electrode instead of forming the through hole electrode of the interposer 2. Specifically, constitution is made such that a part of the solder ball 5 arranged in a protruded state from the bottom surface of the insulating substrate 21 exists in the through hole 23a opened in the thickness direction of the insulating substrate of the interposer 2, and it is connected with the other end portion (through hole land portion) 22b of the connection electrode 22 formed on the top surface of the insulating substrate 21 at the top end portion of the solder ball 5. With this method, there is no need to form the conductive film by the plating method in the through hole 23a of the insulating substrate 21 when forming the interposer 2, and the plating processing becomes needless. Thus, shortening of the processing time and reduction of the conductive material can be realized, and easier manufacturing and lower manufacturing cost can be achieved. Note that the through hole portion 22b of the connection electrode 22 is prevented from peeling due to connection with the solder ball 5 even in the case where the connection electrode 22 is peeled in the region from the chip land portion 22a to the interconnecting portion 22c, which is the same as the foregoing embodiments.

Figure 13:
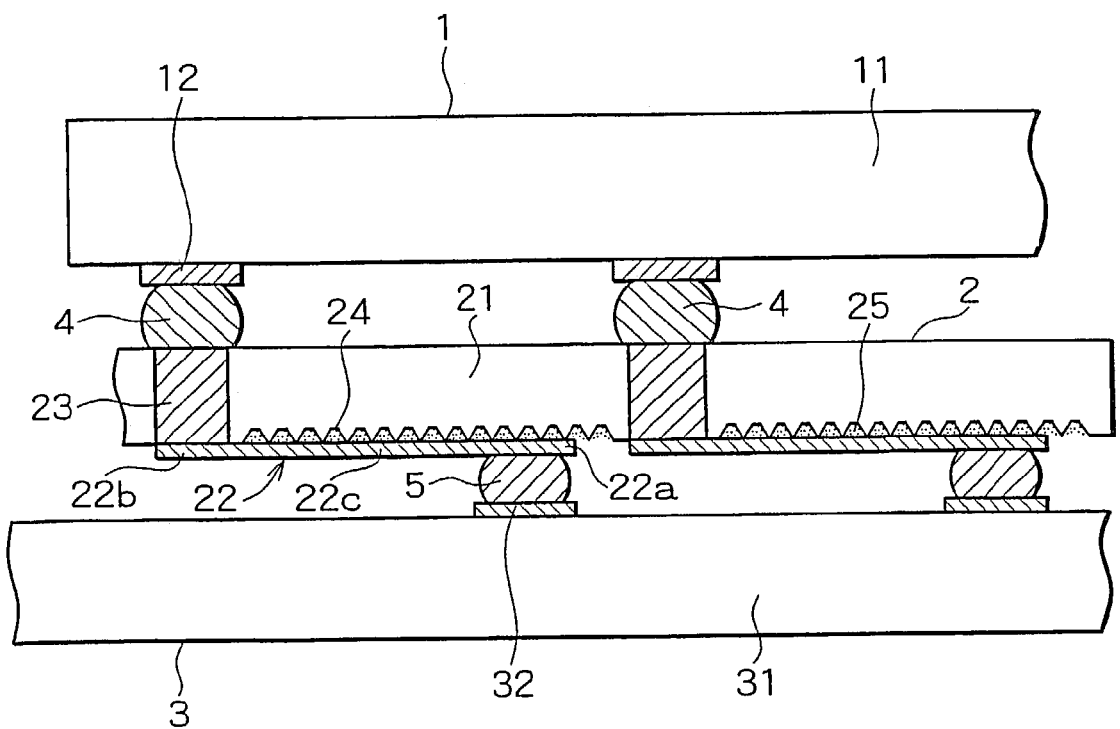
FIG. 13 is a cross-sectional view of further another different embodiment of the present invention.

Although each of the foregoing embodiments is the example where the connection electrode 22 according to the present invention has been applied to the area connected with the solder bump 4 that connects the semiconductor chip 1 with the interposer 2, it can also be applied to an area of the solder ball 5 that connects the interposer 2 with the mother board 3. For example, as the cross-sectional view is shown as the fifth embodiment in FIG. 13, the semiconductor chip 1 is mounted on the interposer 2 having substantially equal coefficient of thermal expansion to that of silicon via the solder bump 4 to constitute the semiconductor device, which is mounted on the mother board 3 via the solder ball 5 provided on the bottom surface of the interposer 2. Herein, the through hole electrode 23 is formed on the insulating substrate 21 of the interposer 2, the unevenness 24 or the like is formed on the bottom surface of the insulating substrate 21 similarly to the connection electrode of the foregoing embodiments, and thus forming the connection electrode 22 that is easily peeled off from the bottom surface of the insulating substrate 21. In the connection electrode 22 formed, the solder ball 5 is formed at the one end portion 22a and the other end portion 22b is connected with the bottom end surface of the through hole electrode 23. Further, the solder bump 4 that makes connection with the semiconductor chip 1 is joined to the top end surface of the through hole electrode 23 on the top surface of the insulating substrate 21.

In this embodiment, thermal stress does not occur between the semiconductor chip 1 and the interposer 2, which have substantially equal coefficient of thermal expansion, when they receive thermal hysteresis, and crack or the like does not occur in the solder bump 4. On the other hand, thermal stress is applied to the solder ball 5 between the interposer 2 and the mother board 3, which have the different coefficient of thermal expansion, but peeling from the bottom surface of the insulating substrate 21 occurs at this point in the one end portion 22a and the interconnecting portion 22c of the connection electrode 22 of the interposer 2 to absorb thermal stress, which can prevent crack or the like from occurring in the solder ball 5 and the wiring land 32.

Figure 14A:
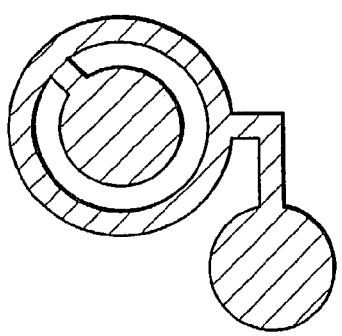
FIGS. 14A to 14H are views showing different pattern shapes of the connection electrode.
Figure 14B:
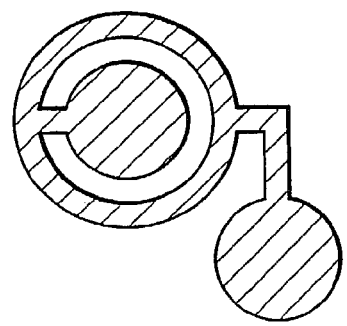
Figure 14C:
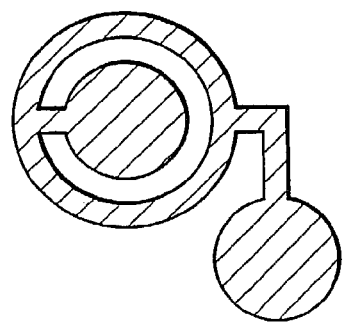
Figure 14D:
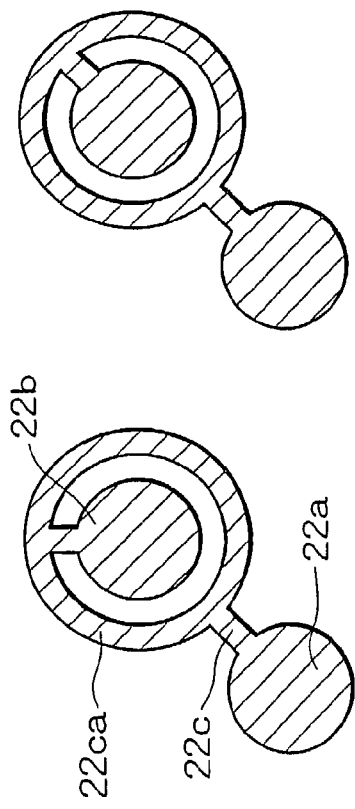
Figure 14E:
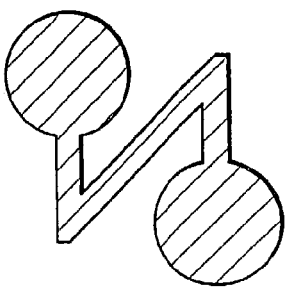
Figure 14F:
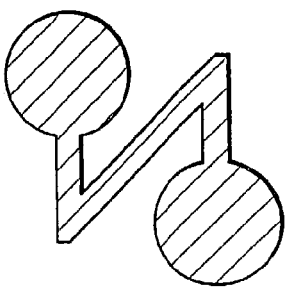
Figure 14G:
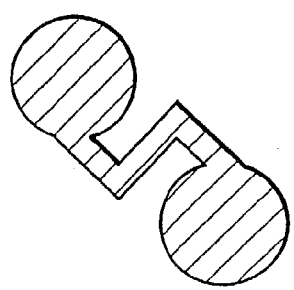
Figure 14H:
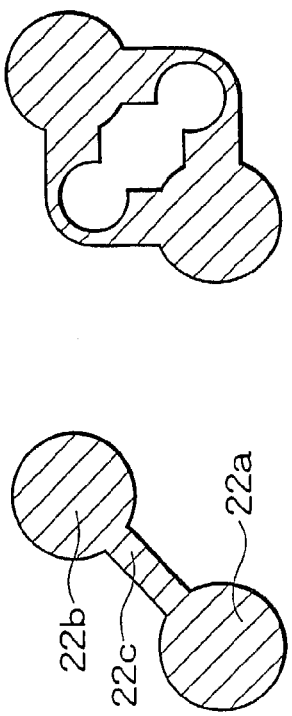

Note that various kinds of patterns shown in FIGS. 14A to 14B can be adopted as the pattern shapes of the connection electrode 22. In these pattern shapes, because FIGS. 14A to 14D are shaped in a circular shape where the arc shape portion 22ca of the interconnecting portion 22c surrounds the other end portion (through hole land portion) 22b, preferable peeling occurs in the connection electrode 22 to absorb the stress when thermal stress occurs in any direction of the planar directions. Further, because the interconnecting portion 22c is formed short in FIGS. 14E to 14H, it is effective in restricting deformation degree of the connection electrode and in stably holding the semiconductor chip even when the connection/electrode 22 is peeled at the one end portion 22a due to thermal stress. Now, it is needless to say that the connection electrode may be formed in patterns other than the ones shown in the drawing.

Furthermore, although the surface low active agent is coated on the unevenness 24 on the surface of the insulating substrate 21 in the foregoing embodiments, a material of low contact characteristic with the connection electrode 22 can be used instead of the surface low active agent. Still further, even in the case where the unevenness is not formed on the surface of the insulating substrate 21, the surface low active agent or another material film may be formed to make the connection electrode 22 easily peel off from the surface of the insulating substrate 21.

As described above, according to the semiconductor device and the manufacturing method of the present invention, in the semiconductor device that comprises: the first member such as the semiconductor chip; and the second member such as the interposer mounting the first member, the second electrode is constituted as the connection electrode that is easily peeled off from the surface of the insulating substrate of the second member in the connection region with the first electrode, which is provided for the second member connected with the first electrode of the first member. Therefore, when thermal stress occurs between the first member and the second member based on the difference of coefficient of thermal expansion and the thermal stress is applied to the first electrode and the second electrode, the connection electrode is peeled off from the surface of the insulating substrate of the second member in one portion to absorb thermal stress by the elastic deformation of the connection electrode, and thus breakage of the first electrode and the second electrode is prevented. Further, since the connection electrode closely contacts with the second member when thermal stress is not applied, the first member can be mounted in the stable state. With this configuration, the arrangement pitch dimension of the first and second electrodes is narrowed, and the highly integrated and highly reliable semiconductor device can be obtained.

What is claimed is:

1. A manufacturing method of a semiconductor device having: a first member having a first electrode; and a second member having a second electrode formed on the surface of the insulating substrate and connected with said first electrode, in which a manufacturing method of said second member comprises the steps of:

forming a through hole on a required position of said insulating substrate;

performing processing to reduce a degree of surface activeness of the surface of a region other than the region of said through hole on the surface of said insulating substrate; and forming the second electrode formed of a connection electrode with a required pattern in the region including said through hole on a surface of said insulating substrate, in which said second electrode is connected with said insulating substrate in said through hole region, and formed in the state that it is easily peeled off from the surface of said insulating substrate in the region other than the through hole, wherein, said performing of processing to reduce the degree of surface activeness of the surface other than the region of said through hole on the surface of said insulating substrate further comprises the steps of:

making the region on the surface of said insulating substrate become a rough surface to form fine concave portions and convex portions; and coating surface low active agent on the surface of said insulating substrate to leave the agent in said concave portions, and said forming of said second electrode further comprises the steps of:

plating a conductive material on the surface of said insulating substrate and the inner surface of the through hole to form a plated film; and forming said plated film in a required pattern to form a through hole electrode and a connection electrode respectively on said through hole inner surface and the surface of said insulating substrate, in which said second electrode is formed in the state that it connects with said through hole electrode in one portion and closely contacts with the insulating substrate at the vertex of the convex portion of said insulating substrate in another portion.

2. The manufacturing method of a semiconductor device according to claim 1, wherein said first member is a semiconductor chip, said first electrode is a conductor bump provided for said semiconductor chip, and said second member is an interposer for mounting said semiconductor chip on a mother board, which has substantially equal coefficient of thermal expansion to that of the mother board, in which the through hole electrode penetrating the insulating substrate of said interposer in a thickness direction is formed, said second electrode, which is formed of the connection electrode connected with said through hole electrode at the other end portion, is formed on the surface of said insulating substrate, and a conductor ball, which is connected with said through hole electrode to make connection with said mother board, is formed on a rear surface of said insulating substrate.

3. The manufacturing method of a semiconductor device according to claim 1, wherein said first member is an interposer mounting a semiconductor chip, which has substantially equal coefficient of thermal expansion to that of the semiconductor chip, said first electrode is a conductor ball provided for said interposer, said second member is a mother board, and said second electrode is a wiring land provided on the surface of said mother board, in which the through hole electrode penetrating the insulating substrate of said interposer in a thickness direction is formed, and the connection electrode is formed, in which said through hole electrode is connected with the other end portion on a rear surface of said insulating substrate and said conductor ball is disposed in one end portion.

4. A manufacturing method of a semiconductor device, comprising:

forming a first member with a first electrode and a second member, the second member comprising an insulating substrate, a second electrode being formed on a surface of the insulating substrate, a portion of the second electrode, located along said surface of the insulating substrate, contacting the first electrode, wherein, manufacturing said second member comprises the steps of forming a through hole at a required position of said insulating substrate;

performing processing to reduce a degree of surface activeness of the surface of a region spaced apart from said through hole; and forming, on the surface of the insulating substrate, the second electrode as a connection electrode with second electrode connected with said insulating substrate in said through hole region, and forming said second electrode to be easily peeled off from the surface of said insulating substrate in the region apart from said through hole, wherein said performing of processing to reduce the degree of surface activeness of the surface other than the region of said through hole on the surface of said insulating substrate further comprises the steps of:

making the region on the surface of said insulating substrate become a rough surface to form fine concave portions and convex portions; and coating surface low active agent on the surface of said insulating substrate to leave the agent in said concave portions, and said forming of said second electrode further comprises the steps of:

plating a conductive material on the surface of said insulating substrate and the inner surface of the through hole to form a plated film; and forming said plated film in a required pattern to form a through hole electrode and a connection electrode respectively on said through hole inner surface and the surface of said insulating substrate, in which said second electrode is formed in the state that it connects with said through hole electrode in one portion and closely contacts with the insulating substrate at the vertex of the convex portion of said insulating substrate in another portion.

5. The manufacturing method of a semiconductor device according to claim 4, wherein said first member is a semiconductor chip, said first electrode is a conductor bump provided for said semiconductor chip, and said second member is an interposer for mounting said semiconductor chip on a mother board, which has substantially equal coefficient of thermal expansion to that of the mother board, in which the through hole electrode penetrating the insulating substrate of said interposer in a thickness direction is formed, said second electrode, which is formed of the connection electrode connected with said through hole electrode at the other end portion, is formed on the surface of said insulating substrate, and a conductor ball, which is connected with said through hole electrode to make connection with said mother board, is formed on a rear surface of said insulating substrate.

6. The manufacturing method of a semiconductor device according to claim 4, wherein said first member is an interposer mounting a semiconductor chip, which has substantially equal coefficient of thermal expansion to that of the semiconductor chip, said first electrode is a conductor ball provided for said interposer, said second member is a mother board, and said second electrode is a wiring land provided on the surface of said mother board, in which the through hole electrode penetrating the insulating substrate of said interposer in a thickness direction is formed, and the connection electrode is formed, in which said through hole electrode is connected with the other end portion on a rear surface of said insulating substrate and said conductor ball is disposed in one end portion.

* * * * *